(12) United States Patent
Kim et al.

(10) Patent No.: US 7,454,685 B2
(45) Date of Patent: Nov. 18, 2008

(54) METHOD AND APPARATUS FOR DECODING LOW DENSITY PARITY CHECK CODE USING UNITED NODE PROCESSING

(75) Inventors: Sang-Hyo Kim, Suwon-si (KR); Sung-Jin Park, Seoul (KR); Han-Ju Kim, Seoul (KR); Min-Goo Kim, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 516 days.

(21) Appl. No.: 11/283,732

(22) Filed: Nov. 22, 2005

(65) Prior Publication Data

US 2006/0123318 A1 Jun. 8, 2006

(30) Foreign Application Priority Data

Nov. 23, 2004 (KR) ................ 10-2004-0096344

(51) Int. Cl.
*H03M 13/00* (2006.01)
(52) U.S. Cl. ...................... 714/758; 714/800
(58) Field of Classification Search ............. 714/758, 714/800
See application file for complete search history.

(56) References Cited

U.S. PATENT DOCUMENTS 6,307,487 B1 * 10/2001 Luby ................... 714/15
6,567,465 B2 * 5/2003 Goldstein et al. ........... 714/758
6,614,366 B2 * 9/2003 Luby ................... 714/15

(Continued)

FOREIGN PATENT DOCUMENTS

CN 1405981 A 3/2003

(Continued)

OTHER PUBLICATIONS

Eran Sharon et al., "An Efficient Message-Passing Schedule for LDPC Decoding", Proc., IEEE Convention of Electrical and Electronics Engineers in Israel, Sep. 6, 2004, pp. 223-226, XP010743004.

(Continued)

*Primary Examiner*—Mujtaba K Chaudry
(74) *Attorney, Agent, or Firm*—Roylance, Abrams, Berdo & Goodman, LLP

(57) ABSTRACT

A method and apparatus are provided for decoding an LDPC code including a plurality of check nodes and a plurality of variable nodes. The apparatus includes a check node selection scheduler that selects at least one of the check nodes, an LLR memory that stores an input LLR value for the variable nodes as an initial LLR value and stores updated LLR values for variable nodes connected to the selected check node, and a check node message memory that stores a check node message indicating a result value of check node processing on the selected check node. The apparatus further includes at least one united node processor that generates a variable node message by subtracting the check node message of the selected check node from corresponding LLR values read from the LLR memory, performs check node processing on the variable node message, calculates an LLR value updated by adding the variable node message to the check node processing result value, and delivers the calculated LLR value to the LLR memory.

20 Claims, 11 Drawing Sheets

U.S. PATENT DOCUMENTS

| | | | |
|---|---|---|---|
| 6,757,122 B1* | 6/2004 | Kuznetsov et al. | 714/795 |
| 6,789,227 B2* | 9/2004 | De Souza et al. | 714/804 |
| 7,318,186 B2* | 1/2008 | Yokokawa et al. | 714/758 |
| 7,395,494 B2* | 7/2008 | Lee et al. | 714/801 |
| 2005/0138519 A1* | 6/2005 | Boutillon et al. | 714/752 |
| 2005/0149840 A1* | 7/2005 | Lee et al. | 714/800 |
| 2005/0283707 A1 | 12/2005 | Sharon et al. | |

FOREIGN PATENT DOCUMENTS

| | | | |
|---|---|---|---|
| CN | 1713530 A | 12/2005 | |
| EP | 1 610 466 A1 | 12/2005 | |

OTHER PUBLICATIONS

Guilloud Frederic, "Architecture Générique de Décodeur de Codes LDPC", Thèse De Docteur De L'ecole Nationale De Supérieure Des Télécommunications, Jul. 2, 2004, pp. 1-166, XP002370625.

Rich Echard et al., "The Pi-Rotation Low-Density Parity Check Codes", Proc., IEEE Global Telecommunications Conf., GLOBECOM '01, San Antonio, TX, Nov. 25, 2001, pp. 980-984, vol. 2 of 6, XP001099251.

* cited by examiner

Step (1)

memory : received signal

Step (2)

memory : check node message

Step (3)

memory : decision bit + llr

METHOD AND APPARATUS FOR DECODING LOW DENSITY PARITY CHECK CODE USING UNITED NODE PROCESSING

CROSS-REFERENCE TO RELATED APPLICATIONS

This application claims the benefit under 35 U.S.C. §119 (a) of Korean Patent Application No. 10-2004-0096344 entitled "Method And Apparatus For Decoding Low Density Parity Check Code Using United Node Processing" filed in the Korean Intellectual Property Office on Nov. 23, 2004, the entire disclosure of which is incorporated herein by reference.

BACKGROUND OF THE INVENTION

1. Field of the Invention

The present invention relates generally to an error correction decoding apparatus and method. More particularly, the present invention relates to a decoding apparatus and method for improving decoding performance by reducing decoding complexity of a Low Density Parity Check (LDPC) code.

2. Description of the Related Art

In general, a digital communication system suffers from errors due to noise generated in a transmission path and corrects the errors with various algorithms to remove the generated errors. In a wireless communication system employing $3^{rd}$ Generation Partnership Project (3GPP) or $3^{rd}$ Generation Partnership Project 2 (3GPP2), which is currently under standardization, the use of convolutional codes and turbo codes is proposed for the transmission of voice and control signals. The turbo code for high-speed transmission is advantageous in that it can obtain a very low bit error rate (BER) at a low signal-to-noise ratio (SNR). However, the turbo code is relatively short in the minimum distance between codewords. As a result, when a signal coded with the turbo code is decoded, an error floor may occur at a desired bit error point, and a detection failure probability for defective codewords during the decoding is relatively high. Recently, therefore, new attention has been given to an LDPC code which is similar or superior to the turbo code in performance.

The LDPC code has greater minimum distance than the turbo code having the same length as that of the LDPC. As a result, the error floor occurs at a very low BER as compared with the turbo code, and the detection failure probability for defective codewords is very low, approximately '0' on an experimental basis. In addition, the LDPC code can be implemented in a parallel structure, contributing to a dramatic reduction in decoding time, and can be subject to efficient decoding stop without a decoding stop algorithm or overhead such as cyclic redundancy check (CRC) bits added through parity check performed every iterative decoding.

FIG. 1 is a diagram illustrating an LDPC structure.

Referring to FIG. 1, the LDPC code is a code having a parity check matrix in which the number of is in each row and column is very small, and its structure can be defined by a factor graph including check nodes 100, variable nodes 110, and edges 115 for connecting the check nodes 100 to the variable nodes 110. A value delivered from the check node 100 to the variable node 110 after check node processing becomes a check node message 115a, and a value delivered from the variable node 110 to the check node 100 after variable node processing becomes a variable node message 115b.

A decoding process of the LDPC code is achieved by iterative decoding based on a 'sum-product' algorithm. The optimal sum-product algorithm includes relatively complex calculations. Another decoding method can be provided based on a suboptimal message-passing algorithm such as a 'min-sum' algorithm, which is a simplified sum-product algorithm.

The LDPC code will now be described in greater detail with reference to FIG. 2.

FIG. 2 is a diagram illustrating an exemplary structure of an LDPC code according to a factor graph and a parity check matrix.

Referring to FIG. 2, a factor graph of an LDPC code includes four check nodes 200 representing predetermined parity check equations of the LDPC code, eight variable nodes 210 representing symbols, and edges 220 representing relationships therebetween. The edges 220 connect each check node 200 to the variable node 210 corresponding to a code symbol included in a parity check equation represented by the check node 200. Herein, the number of the variable nodes 210 connected to each of the check nodes 200 is fixed at 6 and the number of the check nodes 200 connected to each of the variable nodes 210 is fixed at 3, thereby illustrating an example of a regular LDPC code. Although not illustrated, an irregular LDPC code can be provided in which the number of edges connected to each of the check nodes 200 and the variable nodes 210 is not fixed.

A parity check matrix (H) 230 corresponding to the factor graph is shown below the factor graph in FIG. 2. This is similar to the graphic expression of the parity check equations. In the parity check matrix 230, the number of 1s in each column and each row is fixed. That is, each column of the parity check matrix 230 has three 1s corresponding to the connections between each of the variable nodes 210 and the check nodes 200, and each row has six 1s corresponding to the connections between each of the check nodes 200 and the variable nodes 210.

A process of decoding the LDPC code is achieved by iterating a process of exchanging messages generated and updated for each individual node by the variable nodes and the check nodes in the factor graph. In this case, each node updates the messages using the sum-product algorithm or a similar suboptimal algorithm. The iterative decoding process of the LDPC code, based on the foregoing process, will now be described herein below.

FIG. 3 is a block diagram of a general LDPC code.

Referring to FIG. 3, an LDPC decoding apparatus includes a memory block 300 for storing received information, a variable node processor 340 for performing variable node-related calculations (hereinafter referred to as "variable node processing"), a check node processor 320 for performing check node-related calculations (hereinafter referred to as "check node processing"), a parity check block 330 for determining whether to perform iterative decoding by checking if all errors were corrected in check nodes, and a memory access controller 310.

A brief description of the LDPC decoding order will now be made herein below.

First, received symbols are stored in the memory block 300 as initial log likelihood ratio (LLR) values of the variable nodes. The LLR values stored in the memory block 300 become variable node output messages to their associated edges.

Second, the check node processor 320 reads variable node values (that is, LLR values which are variable node messages) stored in the memory block 300. The parity check block 330 performs parity check on the read variable node values, and the check node processor 320 calculates a transmission path transition probability as 0 and 1, of the read variable node values and overwrites the calculated probability values (that is, check node messages) back in the memory block 300 as variable node values.

Third, the variable node processor 340 reads the variable node values overwritten in the memory block 300, and calculates variable node messages including final LLR values using the read variable node values.

Fourth, the second and third processes are iterated until the parity check block 330 succeeds in parity check and determines to stop the iterative decoding, thereby increasing reliability.

The variable node processor 340 and the check node processor 320 read and calculate values from memory areas corresponding to positions of 1s in the columns and rows of a parity check matrix, respectively, and overwrite the calculated values back in the same memory areas.

In the second and third processes, the variable node processor 340 and the check node processor 320 each calculate output messages through input values (that is, check node messages and variable node messages) received from the edges connected thereto. Specifically, the check node processor 320 and the variable node processor 340 each calculate values read from sub-metric blocks in the memory block 300, being mapped to positions of 1s in rows and columns of the parity check matrix, and store the calculated values therein.

A process of calculating the variable node messages and the check node messages will now be described in greater detail herein below. Herein, a degree $d_c$ represents the number of variable nodes connected to a check node and is equal to the number of 1s existing in each column in the parity check matrix, and a degree $d_v$ represents the number of check nodes connected to a variable node and is equal to the number of 1s existing in each row in the parity check matrix.

First, a check node message transmitted from an $m^{th}$ check node to an $n^{th}$ variable node is updated using Equation (1) below.

$$r_{mn} = \tanh^{-1}\left(\prod_{i=1}^{d_c-1} \tanh\left(\frac{q_i^{(j)}}{2}\right)\right) \quad (1)$$

That is, Equation (1) represents an equation for $j^{th}$ iterative decoding on a message of the $m^{th}$ check node connected to $d_c$ variable nodes, and $q_i^{(j)}$ denotes a message generated by reordering a variable node message delivered to the $m^{th}$ check node. When a variable node message delivered from an $n^{th}$ variable node to an $m^{th}$ check node is denoted by $q_{nm}^{(j)}$, the reordering is performed on the basis of $q_0^{(j)}=q_{nm}^{(j)}$. A message $r_{mn}^{(j)}$ delivered from the $m^{th}$ check node to the $n^{th}$ variable node is comprised of a non-linear function of input variable node messages, except for $q_0^{(j)}$.

Next, a variable node message is updated in accordance with Equation (2) below.

$$q_{nm}^{(j+1)} = q_{nm}^{(0)} + \sum_{i=1}^{d_v-1} r^{(j)} \quad (2)$$

Equation (2) represents an equation for an $n^{th}$ variable node with a degree $d_v$, and the variable node message becomes the sum of an initial LLR value $q_{nm}^{(0)}$ and input check node messages, except for $r_0^{(j)}=r_{mn}^{(j)}$ indicative of an input from the $m^{th}$ check node.

Finally, at each iterative decoding, the LLR value is updated using Equation (3) below.

$$L_n^{(j+1)} = L_n^0 + \sum_{i=0}^{d_v-1} r_{i(j)} \quad (3)$$

Herein, $L_n^{(j)}$ denotes an LLR value after $(j+1)^{th}$ iterative decoding of an $n^{th}$ variable node, and is updated with the sum of an initial LLR value $L_n^{(0)}$ and input check node messages.

As can be noted from Equation (2) and Equation (3), the variable node message update and the LLR update can be implemented simply with the summation, but the check node message update is expressed in a non-linear function, causing an increase in hardware complexity. Accordingly, there is a need for an optimal algorithm for reducing the hardware complexity.

As described above, a calculation algorithm for separately performing check node processing and variable node processing uses a high-capacity memory. That is, the memory block 300 must store therein information on all of the edges, and the check node processor 320 and the variable node processor 340 each read necessary values from the memory block 300 to perform corresponding calculations and calculate LLR values. In this case, the algorithm performs variable node processing after performing check node processing on all of the edges. As a result, the variable node processor 340 is disabled while the algorithm performs the check node processing. Likewise, while the algorithm performs variable node processing, the check node processor 320 is disabled. That is, the algorithm must read various types of data from the single memory block to perform corresponding processing, causing a memory access delay.

Accordingly, a need exists for a method and apparatus for improving decoding performance by reducing decoding complexity of a Low Density Parity Check (LDPC) code.

SUMMARY OF THE INVENTION

An object of the present invention is to substantially solve at least the above problems and disadvantages and to provide at least the advantages below. Accordingly, an object of the present invention is to provide a decoding algorithm for the effective and efficient implementation of an LDPC decoder, and an LDPC decoder structure appropriate therefor.

Another object of the present invention is to provide a memory structure for the effective and efficient implementation of an LDPC decoder, and an efficient decoding algorithm according thereto.

Another object of the present invention is to provide a method and apparatus for minimizing memory segmentation in an LDPC decoder, and alternately performing check node processing and variable node processing.

According to one aspect of the present invention, an apparatus is provided for decoding a low density parity check (LDPC) code that includes a plurality of check nodes and a plurality of variable nodes according to a parity check matrix. The apparatus comprises a check node selection scheduler for selecting at least one check node for check node processing among the check nodes, a log likelihood ratio (LLR) memory for storing an input LLR value for the variable nodes as an initial LLR value and storing updated LLR values for variable nodes connected to the selected check node, and a check node message memory for storing a check node message indicative of a result value of check node processing on the selected check node. The apparatus further comprises at least one united node processor for generating a variable node message by subtracting the check node message of the selected check node stored in the check node message memory from corresponding LLR values read from the LLR memory, performing check node processing on the variable node message, calculating an LLR value updated by adding the variable node message to the check node processing result value, and delivering the calculated LLR value to the LLR memory.

According to another aspect of the present invention, a method is provided for decoding a low density parity check (LDPC) code that includes a plurality of check nodes and a plurality of variable nodes according to a parity check matrix. The method comprises the steps of selecting at least one check node for check node processing among the check nodes, reading a check node message corresponding to the selected check node and calculating a variable node message by subtracting the check node message value from a log likelihood ratio (LLR) value of variable nodes connected to the check node, generating a check node message by performing check node processing on the calculated variable node message, and storing the generated check node message. The method further comprises the steps of calculating an updated LLR value by adding the generated check node message to the LLR value and storing the updated LLR value, and performing hard-decision decoding and parity check on the updated LLR value.

BRIEF DESCRIPTION OF THE DRAWINGS

The above and other objects, features and advantages of the present invention will become more apparent from the following detailed description when taken in conjunction with the accompanying drawings, in which.

DETAILED DESCRIPTION OF THE EXEMPLARY EMBODIMENTS

Figure 1:
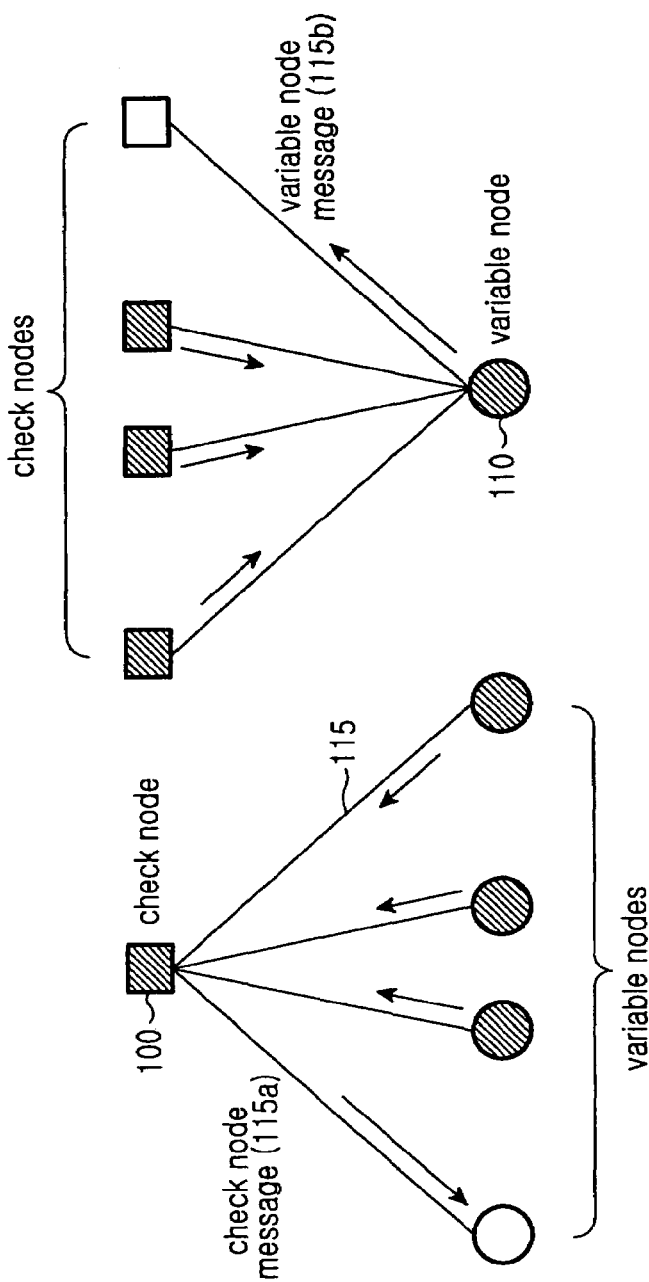
FIG. 1 is a diagram illustrating a general LDPC decoding structure.
Figure 2:
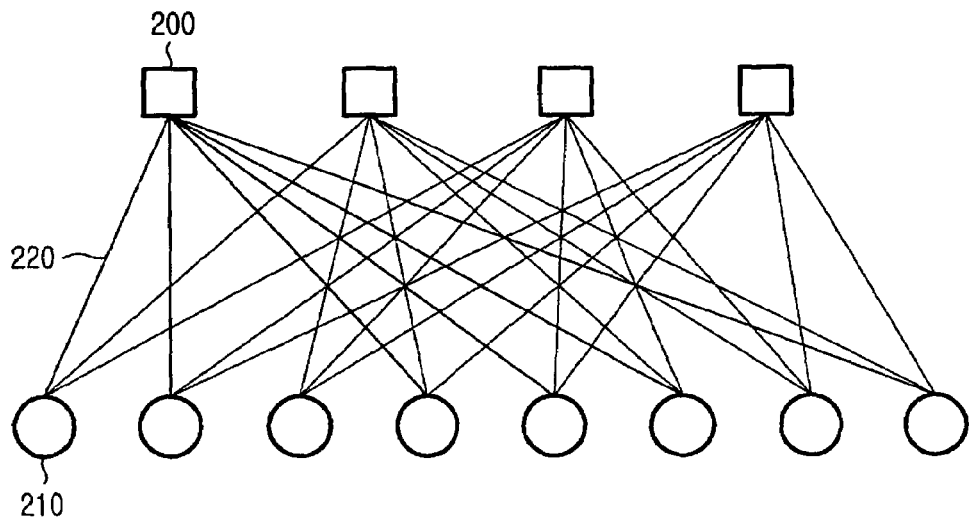
FIG. 2 is a diagram illustrating an exemplary factor graph and a parity check matrix.
Figure 3:
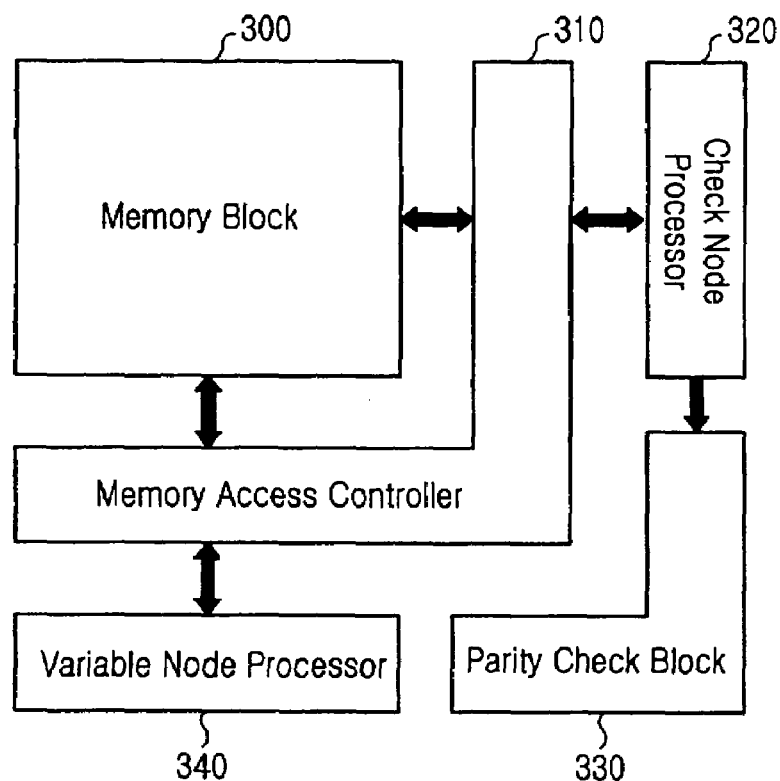
FIG. 3 is a block diagram of a general LDPC code.

Exemplary embodiments of the present invention will now be described in detail with reference to the annexed drawings. In the drawings, the same or similar elements are denoted by the same reference numerals even though they are depicted in different drawings. In the following description, a detailed description of known functions and configurations incorporated herein has been omitted for clarity and conciseness.

Figure 4:
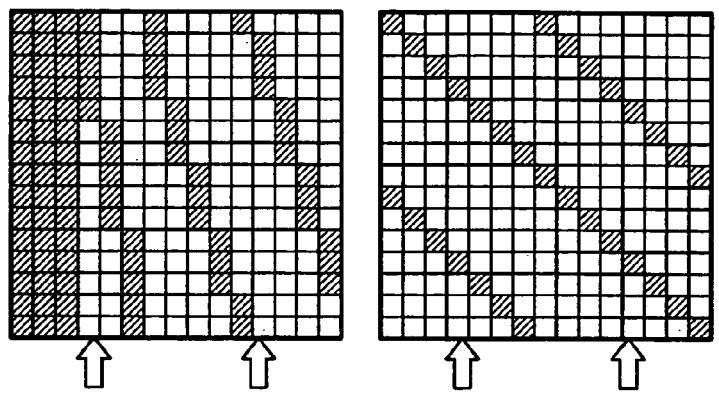
FIG. 4 is a diagram illustrating a decoding process according to conventional memory segmentation.
Figure 4:
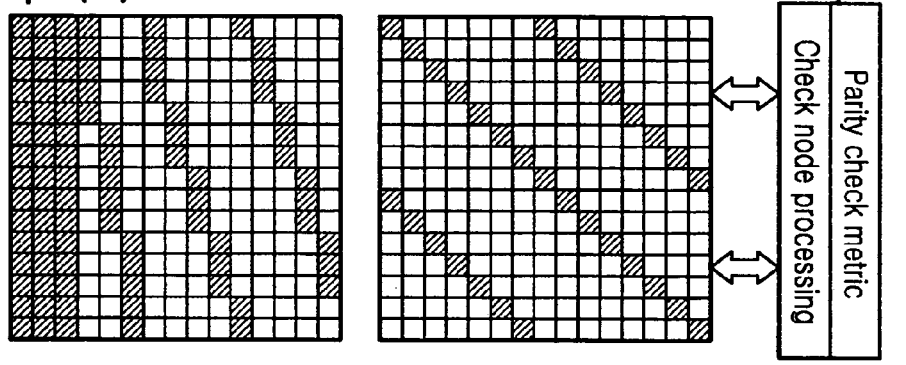
Figure 4:
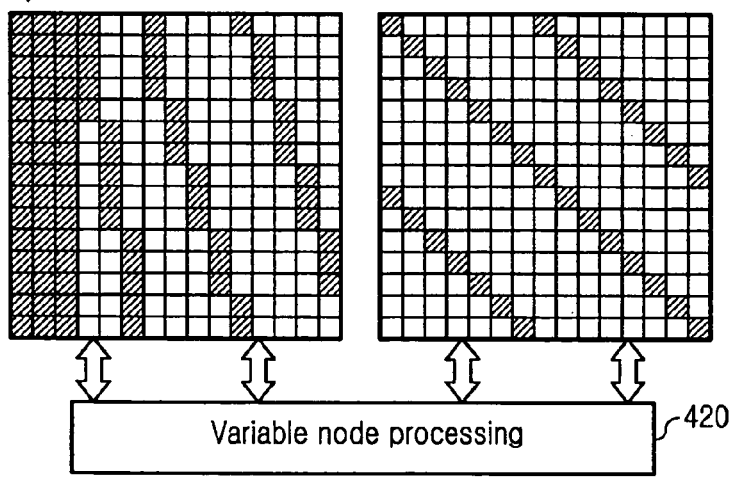

FIG. 4 is a diagram illustrating memory segmentation according to a general decoding process.

Referring to FIG. 4, a memory is provided for a parity check matrix and an identity matrix, respectively. The memories are each segmented into as many sub-metric blocks as the number of nodes, such as check node processors and variable node processors. That is, the rows of the memories are connected in parallel to check nodes, and sub-metric blocks segmented from the columns of the memories are connected in parallel to variable nodes. Each of the small shaded blocks represents a sub-metric block in which a received signal '1' is stored.

In Step 1, received information is input to the sub-metric blocks of each memory.

In Step 2, a check node processing block 410 performs check node processing and parity check on each of the values of the sub-metric blocks segmented from each column, and thereafter, stores the result values of the check node processing back in the sub-metric blocks, thereby updating check node messages.

In Step 3, a variable node processing block 420 reads the values updated in the sub-metric blocks of each row, performs variable node processing on the read values, performs hard-decision decoding and LLR calculations, and thereafter, stores the result values back in the sub-metric blocks, thereby updating variable node messages. A size of the sub-metric blocks of the memories is determined according to the number of variable node and check node processors. Therefore, an increase in the number of the variable node and check node processors increases the number of the sub-metric blocks segmented from the memories, causing an increase in hardware complexity. However, a decrease in the number of the variable node and check node processors decreases the number of the sub-metric blocks segmented from the memories, causing a reduction in memory access speed and throughput.

Figure 5:
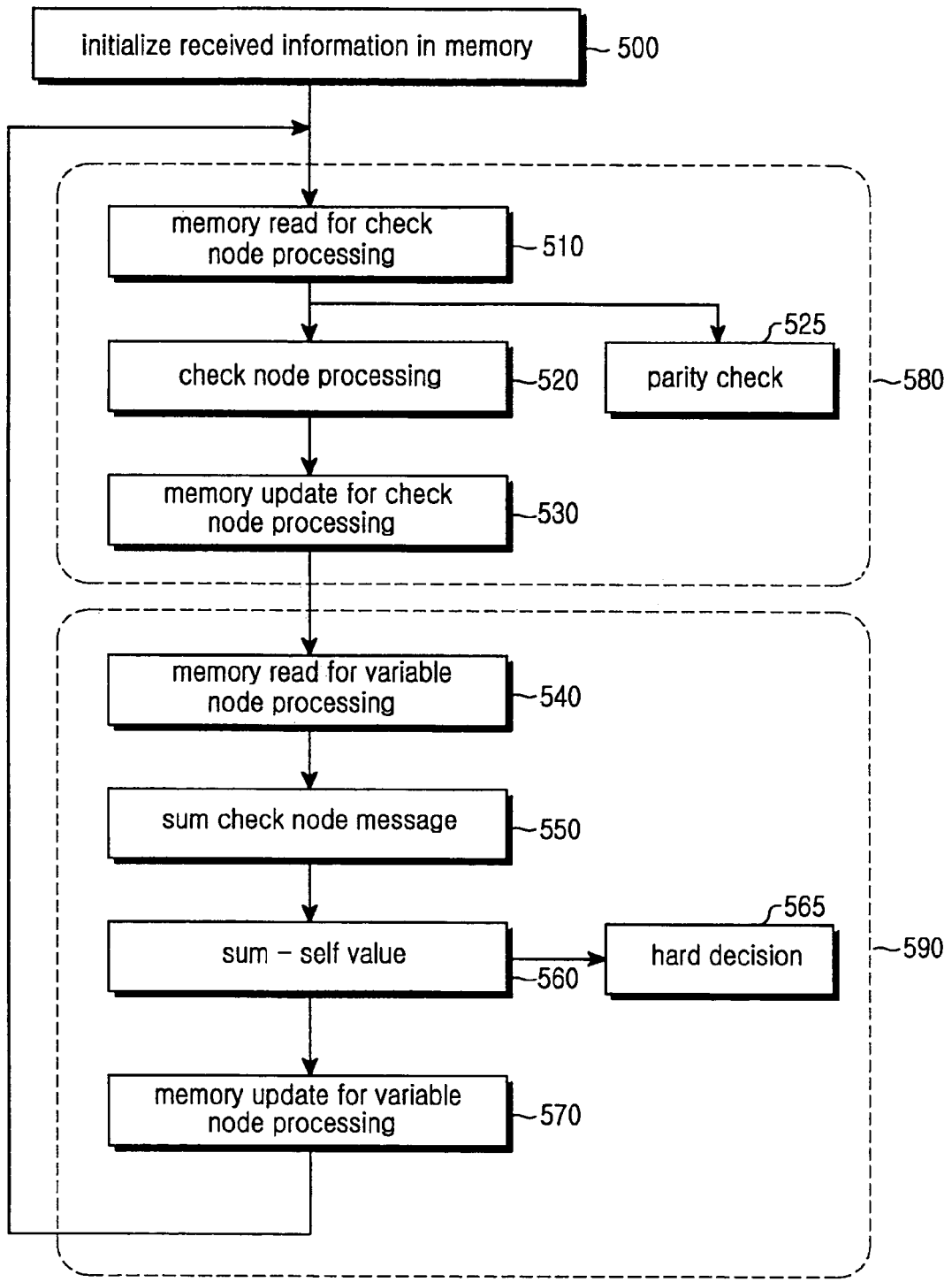
FIG. 5 is a flowchart of a conventional decoding algorithm.

FIG. 5 is a flowchart of a general LDPC decoding algorithm.

Referring to FIG. 5, a check node processing process 580 and a variable node processing process 590 are connected on a cyclic basis, and one calculation process is performed after another calculation process is completed. The two calculation processes are iterated until the algorithm succeeds in parity check.

In step 500, a check node processor reads received information and stores the read information in a memory. This process is called "initialization of LDPC decoding."

The check node processor reads information bits stored in sub-metric blocks of the memory in step 510, and performs check node processing in step 520 while checking parity of the information bits in step 525. If the parity check result is 'good', the check node processor stops the iteration (that is, iterative decoding). Otherwise, the check node processor updates a variable node value in the memory using the check node processing result value in step 530, thereby updating a check node message. After performing the check node message update process, the check node processor proceeds to the variable node processing process 590.

In step 540, a variable node processor reads variable node values updated according to the check node message, from sub-metric blocks of the memory. The variable node processor sums the updated variable node values in step 550, subtracts variable node values of a corresponding row from the summation result value in step 560, and performs hard-decision decoding on the subtraction result values in step 565. In step 570, the variable node processor stores the subtraction result values in the sub-metric blocks of the memory as variable node values, and then returns to step 510.

As described above, the general LDPC decoding algorithm performs variable node processing after performing check node processing on all of the information bits. That is, because one iterative decoding process comprises two steps of check node processing and variable node processing, the decoding algorithm performs the check or variable node processing with the previous-step variable or check node message. Therefore, the decoding algorithm can store the check node messages and the variable node messages using a single memory, but it has a low convergence speed of the iterative decoding performance. In addition, although the decoding algorithm can be implemented with a parallel node processor structure, it requires as many processors as the number of nodes for actual implementation, causing an excessive increase in the hardware complexity. Accordingly, the decoding algorithm can be difficult to implement.

Therefore, an exemplary embodiment of the present invention provides a decoding algorithm for alternately iterating check node processing and variable node processing for one iterative decoding process. The novel decoding algorithm generates new messages using updated messages in one iterative decoding process, contributing to an increase in convergence speed of the iterative decoding performance. Alternatively, the novel decoding algorithm may sequentially alternately decode check nodes and variable nodes either on a one-by-one basis or on a group-by-group basis. The use of updated messages during one iterative decoding process increases the convergence speed. In this case, an increase in the required memory capacity, caused by always storing both the variable node messages and the check node messages, can be minimized by segmenting the memory into as many sub-metric blocks as either the number of check nodes or the number of check node processors according to the decoding scheme.

A detailed description will now be made of an exemplary method for performing check node processing and variable node processing according to an embodiment of the present invention.

A memory in an LDPC decoder stores LLR values mapped to their associated check node messages and variable node messages. The LDPC decoder starts its operation as it selects a check node to be decoded. Variable node and check node processing and LLR updates are performed in one united node processing.

First, in accordance with Equation (4) below, an instantaneous LLR value of an input LLR value is stored for each variable node, and each check node message is set to '0'.

$$LLR = L_n^{(0)}, r_{mn}^{(0)} = 0 \quad (4)$$

Second, check nodes $c_m$ are selected. There are any number of methods for selecting check nodes and possible selection orders. After indexing the check nodes in one or more groups, the decoding algorithm can either sequentially select the check nodes in the indexed order or uniformly select the check nodes according to a predetermined rule. Alternatively, the decoding algorithm may select the individual check nodes at different selection rates, taking their decoding cycle characteristics into account. For purposes of the following explanation, it will be assumed herein that one check node is selected.

Third, all variable node messages associated with the check nodes $c_m$ are generated. The variable node messages are generated by subtracting the check node messages of the edges connected to the check nodes $c_m$ from instantaneous LLR values of the corresponding variable nodes in accordance with Equation (5) below.

$$q_{nm}^{(j+1)} = L_n^i - r_{mn}^{(j)} \quad (5)$$

In Equation (5), n denotes indexes of variable nodes connected to check nodes $c_m$, and has a range of $n_0$ through $n_{d_c-1}$. The value $L_n^I$ denotes an instantaneous LLR value of an $n^{th}$ variable node in the step before node processing on the selected check nodes $c_m$ is performed.

Fourth, check node processing is performed using the generated variable node messages in accordance with Equation (6) below.

$$r_{mn}^{(j+1)} = F(q_{n_1 m}^{(j+1)}, \ldots q_{n_{d_c-1} m}^{(j+1)}), \text{ when } n_0 = n \quad (6)$$

In Equation (6), F denotes a check node processing function, which is a non-linear function comprised of input variables, except for $q_{nm}^{(j+1)}$, and can be implemented in various methods. Equation (1) is a typical example thereof.

Fifth, after storing the check node messages calculated through Equation (6) in a memory as their check node values, the novel decoding algorithm updates LLR values in accordance with Equation (7) below, using new check node messages from the variable node messages in the third process, which were temporarily stored while performing the fourth step.

$$L_n^0 = q_{nm}^{(j+1)} + r_{mn}^{(j+1)} = L_n^I - r_{mn}^{(j)} + r_{mn}^{(j+1)} \quad (7)$$

Sixth, after completing one iterative decoding by selecting all of the check nodes one by one, the decoding algorithm performs parity check using the updated LLR values. If the parity check result is 'good', the decoding algorithm stops the iterative decoding. Otherwise, the decoding algorithm returns to the second process. For the parity check, the decoding algorithm can check the parity check nodes at every update in the check node processor.

As described above, the decoding algorithm according to an embodiment of the present invention uses a united node processor for previously storing only the check node messages of the corresponding check nodes and instantaneous LLR values in the memory of the LDPC decoder, and simultaneously performing variable node processing and check node processing on the corresponding check nodes using the check node messages and the instantaneous LLR values. The use of the united node processor contributes to fast decoding convergence without an increase in calculations. That is, each time united node processing is performed on each check node, LLR values adjacent to the check node are updated, affecting check node processing of the next check node.

Figure 6A:
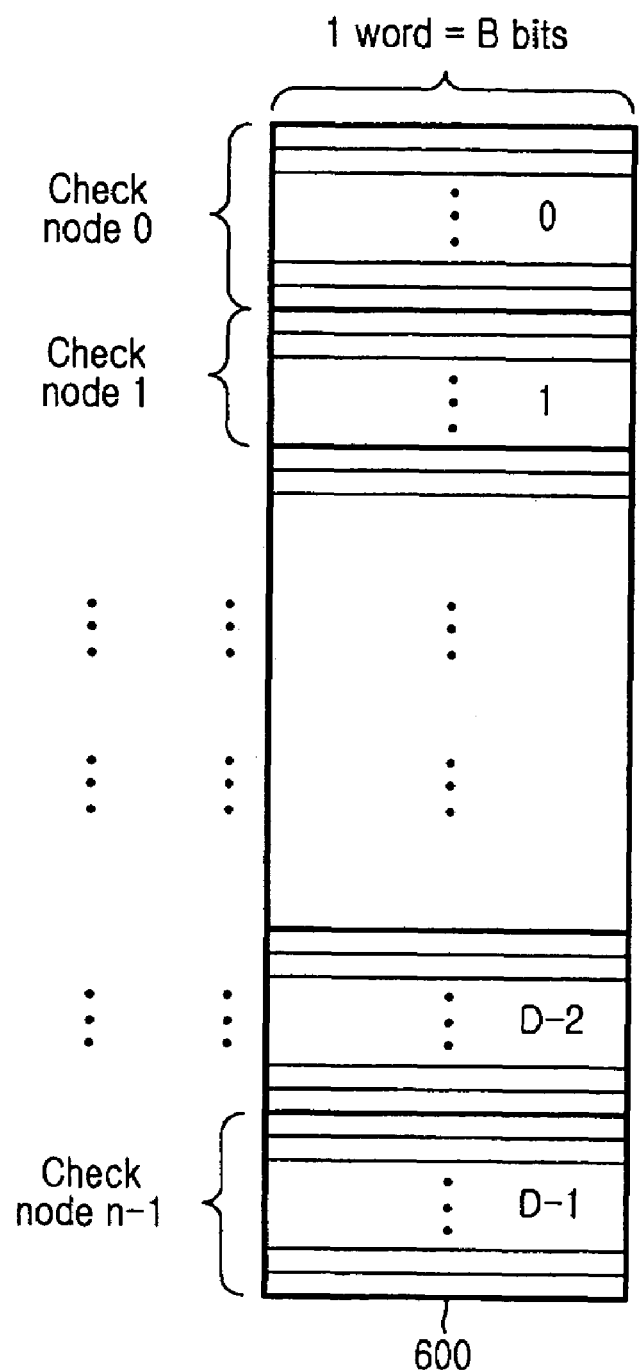
FIG. 6A is a diagram illustrating a memory configuration according to an embodiment of the present invention.

FIG. 6A is a diagram illustrating a memory configuration according to an embodiment of the present invention.

Referring to FIG. 6A, a memory 600 is segmented into as many blocks as the number D of check nodes, and each of the segmented blocks stores a check node message for its associated check node. In the decoding process, check node messages mapped to the check nodes are sequentially read, and the check node message stored in each block is called "1 word."

Figure 6B:
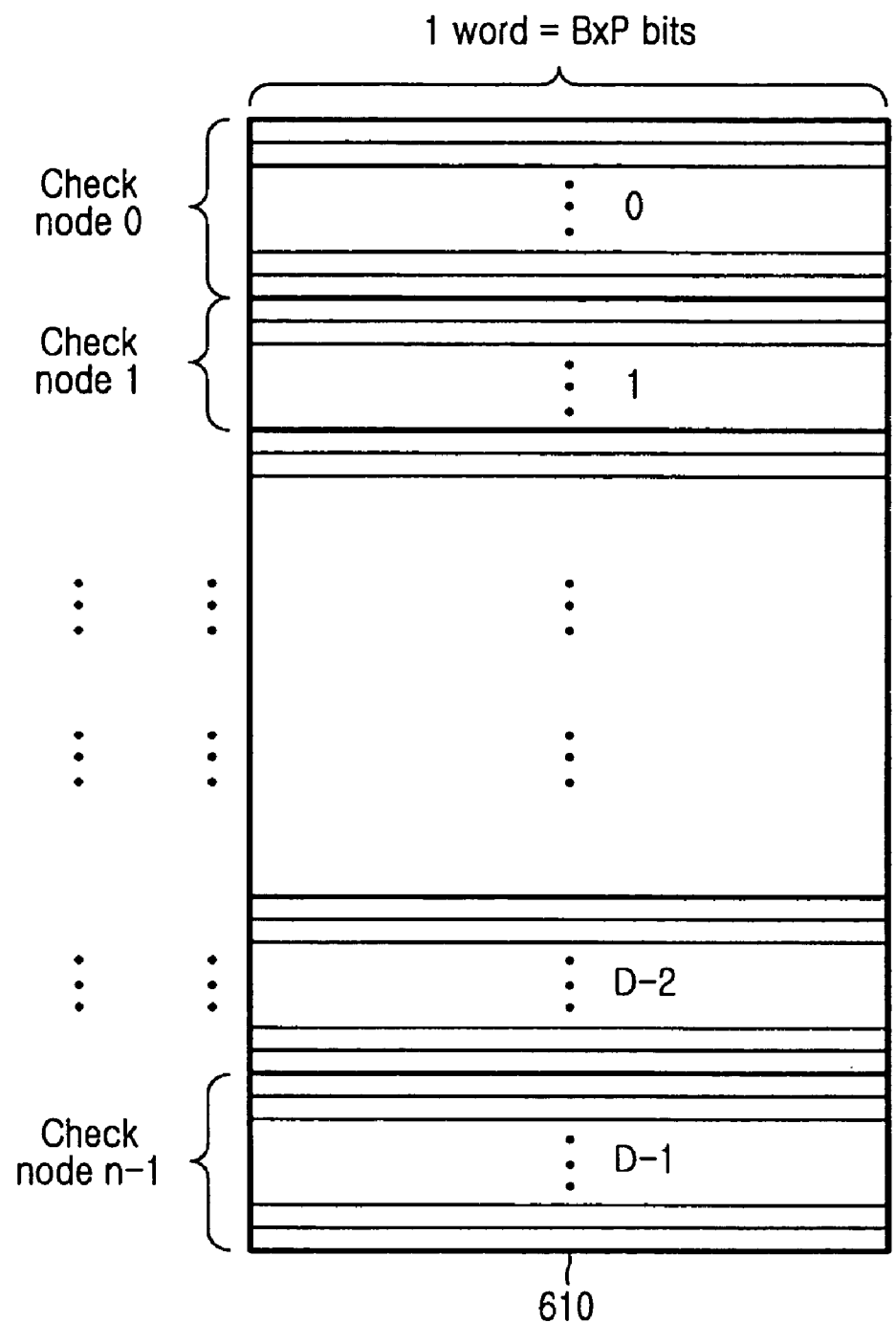
FIG. 6B is a diagram illustrating a memory configuration according to another embodiment of the present invention.

FIG. 6B is a diagram illustrating a memory configuration according to another embodiment of the present invention.

Referring to FIG. 6B, a memory configuration is shown that is suitable for a structure of a parallel decoder that can be applied to a block-type LDPC code. A memory 610 is segmented into as many blocks as the number D of check nodes. Each of the segmented blocks stores P check node messages as one word, and the P check node messages are simultaneously read and written, thereby enabling a structure of the parallel decoder. The structure of the parallel decoder is described in greater detail below with reference to FIG. 10.

Figure 7:
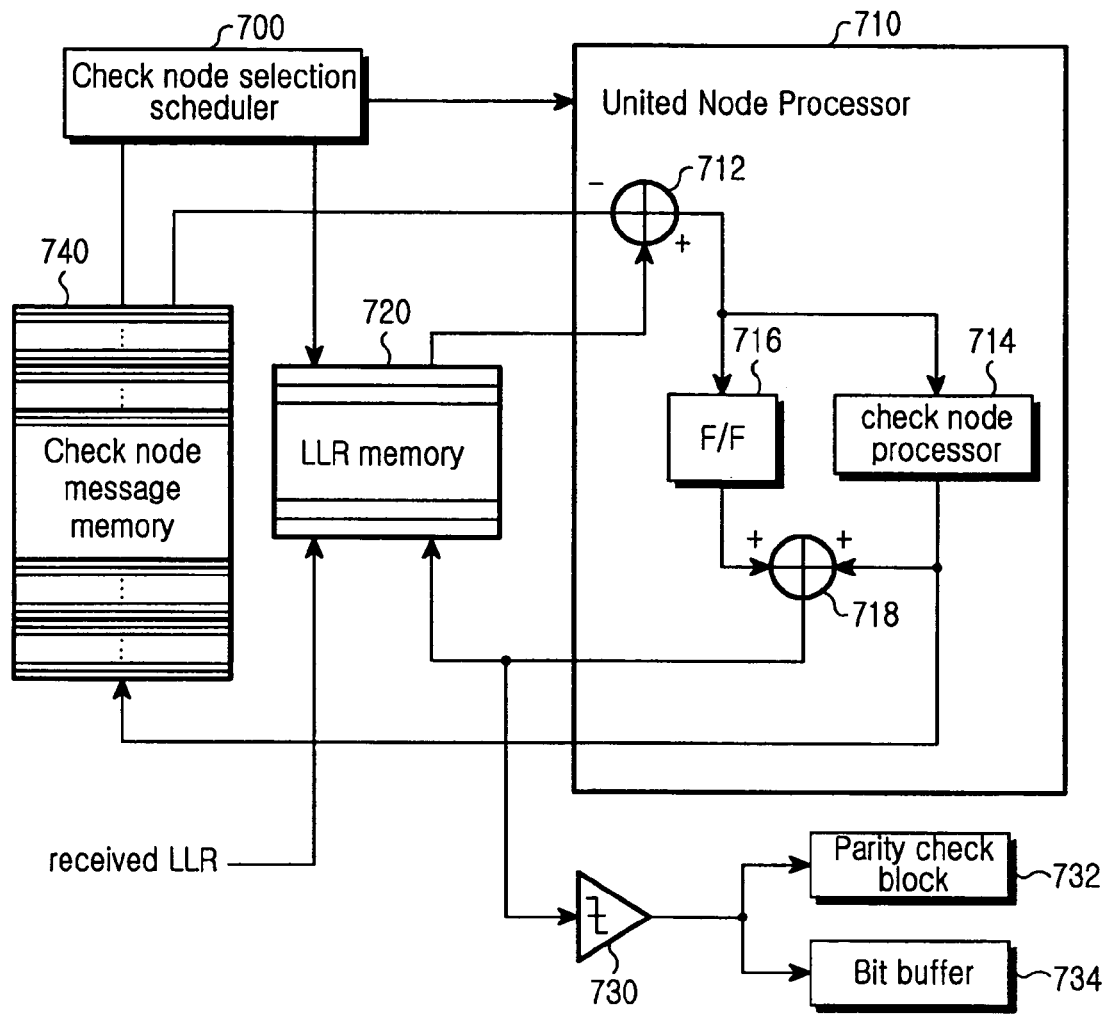
FIG. 7 is a diagram illustrating a structure of an LDPC decoder according to an embodiment of the present invention.

FIG. 7 is a diagram illustrating an exemplary structure of an LDPC decoder according to an embodiment of the present invention.

Referring to FIG. 7, an LDPC decoder comprises a check node selection scheduler 700, a united node processor 710 for performing check node processing and LLR update, an LLR memory 720 segmented into as many blocks as the number of check nodes of a check node processor 714, a check node message memory 740, and a hard-decision block 730.

Every cycle, the check node selection scheduler 700 selects a check node for check node processing among the check nodes of the united node processor 710 according to a predetermined rule.

The LLR memory 720 stores an input LLR value as an initial value, and the check node message memory 740 initializes initial values of check node messages to '0', and thereafter, stores check node processing result values for the corresponding check nodes. That is, the check node message memory 740 stores check node messages generated by performing check node processing in its segmented sub-metric blocks, which are mapped to their associated check nodes.

The united node processor 710 comprises a subtractor 712, a check node processor 714, a flip-flop (F/F) 716, and an adder 718, and simultaneously updates variable node messages, check node messages and LLR values.

Once the check node selection scheduler 700 selects a check node, the subtractor 712 generates a variable node message by subtracting a check node message corresponding to the selected check node, stored in the check node message memory 740, from a corresponding LLR value read from the LLR memory 720. The subtractor 712 then stores the generated variable node message in the flip-flop 716, and at substantially the same time, also inputs the generated variable node message to the check node processor 714. Herein, the corresponding LLR value is an LLR value of a variable node connected to the selected check node.

The check node processor 714 performs check node processing on the input variable node message using Equation (6). The check node processing result value is stored in the check node message memory 740, and at substantially the same time, is also input to the adder 718. The adder 718 calculates an updated LLR value by adding the variable node message stored in the flip-flop 716 to the check node processing result value calculated using Equation (7). The updated LLR value is stored in the LLR memory 720, and at substantially the same time, is also input to the hard-decision block 730.

The hard-decision block 730 selects one of 0 and 1 by performing hard-decision on the updated LLR value. A bit buffer 734 stores the hard-decision value output from the hard-decision block 730, and a parity check block 732 performs parity check on the hard-decision value. If the parity check result output from the parity check block 732 is 'good', the LDPC decoder stops the iterative decoding and outputs the hard-decision value stored in the bit buffer 734 as a decoding result value. However, if the parity check result is 'bad', the check node selection scheduler 700 selects the next check node. There are various possible parity check conditions. For example, the parity check can be performed when all of the check nodes have been selected one by one.

As illustrated in FIG. 7, the LDPC decoder according to an exemplary embodiment of the present invention, performs variable node processing with a previous-step LLR value stored in the LLR memory 720, at substantially the same time it generates a variable node message after check node processing. That is, an output of the check node processing is directly used for the update of a variable node message, contributing to an increase in convergence speed and a decrease in the number of iterations. In addition, for the same iterations, the convergence speed increases, improving throughput and performance.

An exemplary decoding algorithm according to an embodiment of the present invention will now be described in greater detail with reference to FIGS. 4 and 8.

Figure 8:
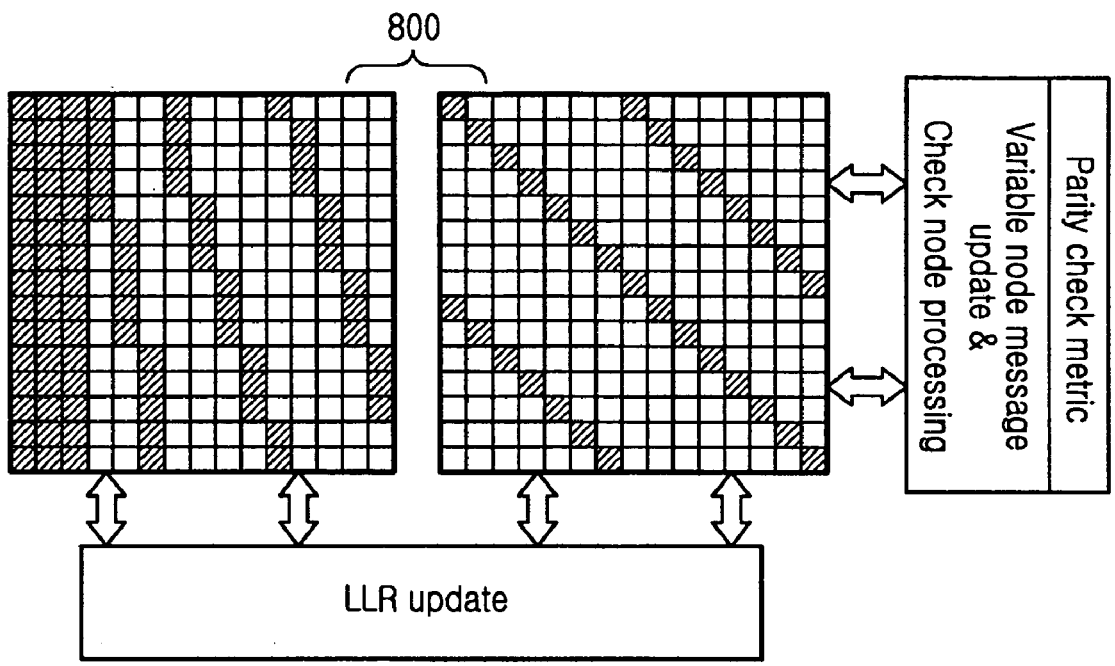
FIG. 8 is a conceptual diagram illustrating a memory configuration applicable to a decoding algorithm according to an embodiment of the present invention.

FIG. 8 is a conceptual diagram illustrating a memory configuration applicable to a decoding algorithm according to an embodiment of the present invention.

The configuration of a memory 800 shown in FIG. 8 is applicable to the check node message memory 740 and the LLR memory 720 of FIG. 7.

Compared with a conventional decoding algorithm that must sequentially perform Step 2 and Step 3 of FIG. 4 to perform one iteration, the novel decoding algorithm performs one iteration by simply selecting all of the check nodes one by one in FIG. 8.

Specifically, referring to FIG. 8, each row in the memory 800 is segmented into as many sub-metric blocks as the number of check node processors, and each of the small shaded blocks stores a value '1' in received information.

That is, each of the sub-metric blocks in the memory 800 stores an updated value of a check node message corresponding to its associated check node. In addition, the memory 800 stores an updated value of an LLR value mapped to a variable node connected to a particular check node.

Figure 9:
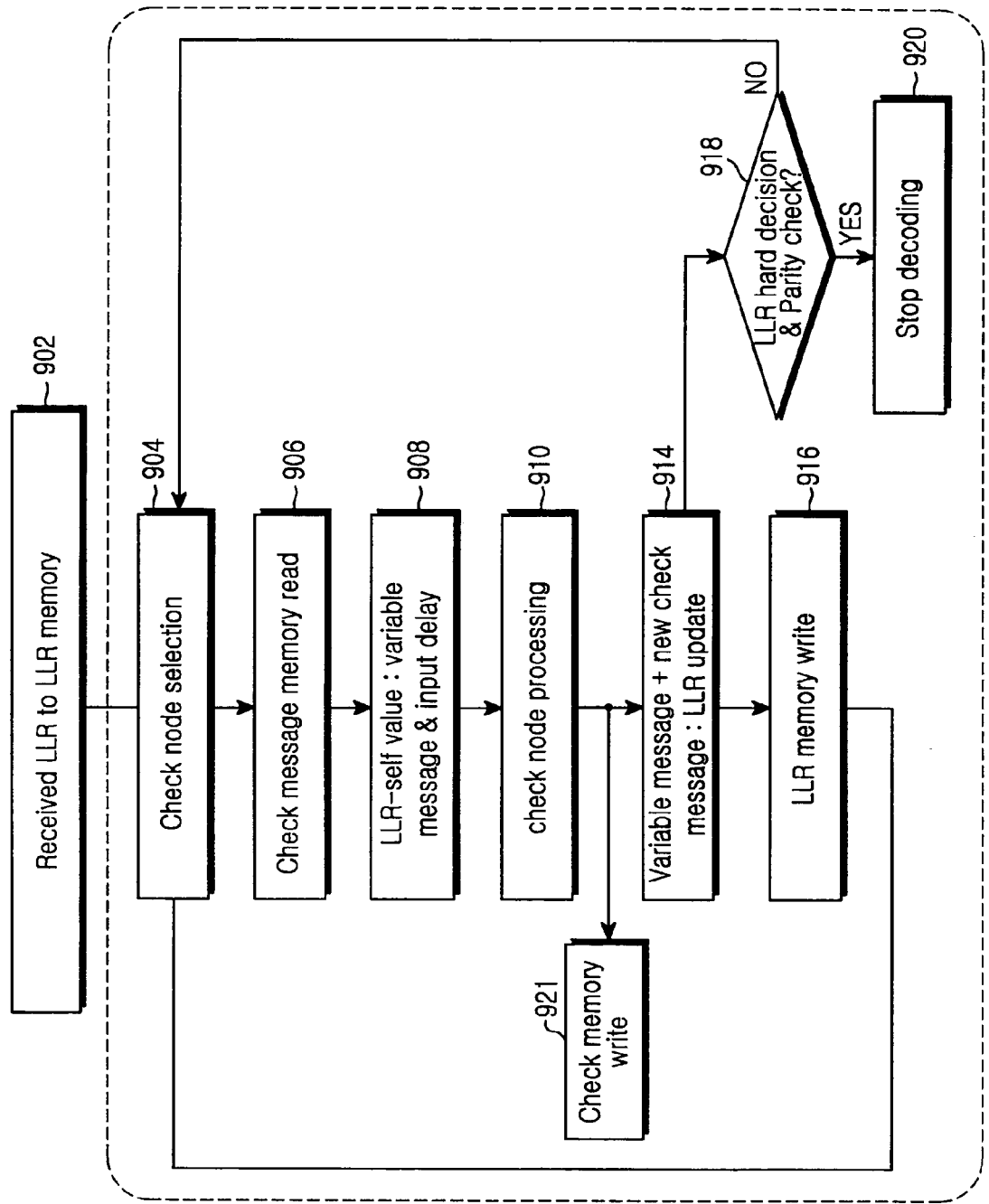
FIG. 9 is a flowchart of a decoding algorithm according to an embodiment of the present invention.

FIG. 9 is a flowchart of a novel decoding algorithm according to an embodiment of the present invention.

Referring to FIGS. 7 and 9, in step 902, an LLR value is input to its associated sub-metric block in the LLR memory 720. In step 904, the check node selection scheduler 700 selects a check node. The number of selected check nodes can be one or more, and the check nodes can be selected either sequentially or uniformly according to a predetermined rule.

In step 906, the united node processor 710 reads a previous check node message corresponding to the selected check node from the check node message memory 740.

In step 908, the united node processor 710 updates a variable node message by subtracting the previous check node message value from the LLR value for variable nodes connected to the selected check node. In step 910, the united node processor 710 generates a check node message by performing check node processing on the updated variable node message. In step 921, the united node processor 710 stores the generated check node message in the check node message memory 740.

The united node processor 710 updates the LLR value by adding the generated check node message to the LLR value in step 914, and stores the updated LLR value in the LLR memory 720 in step 916. At substantially the same time, in step 918, the updated LLR value undergoes hard-decision decoding and parity check. If the parity check result is 'good', the decoding algorithm stops iterative decoding in step 920. If the parity check result is 'bad', the decoding algorithm returns to step 904 and continues to perform the iterative decoding.

A description will now be made of an LDPC decoder comprising a plurality of parallel united node processors according to another embodiment of the present invention.

Figure 10:
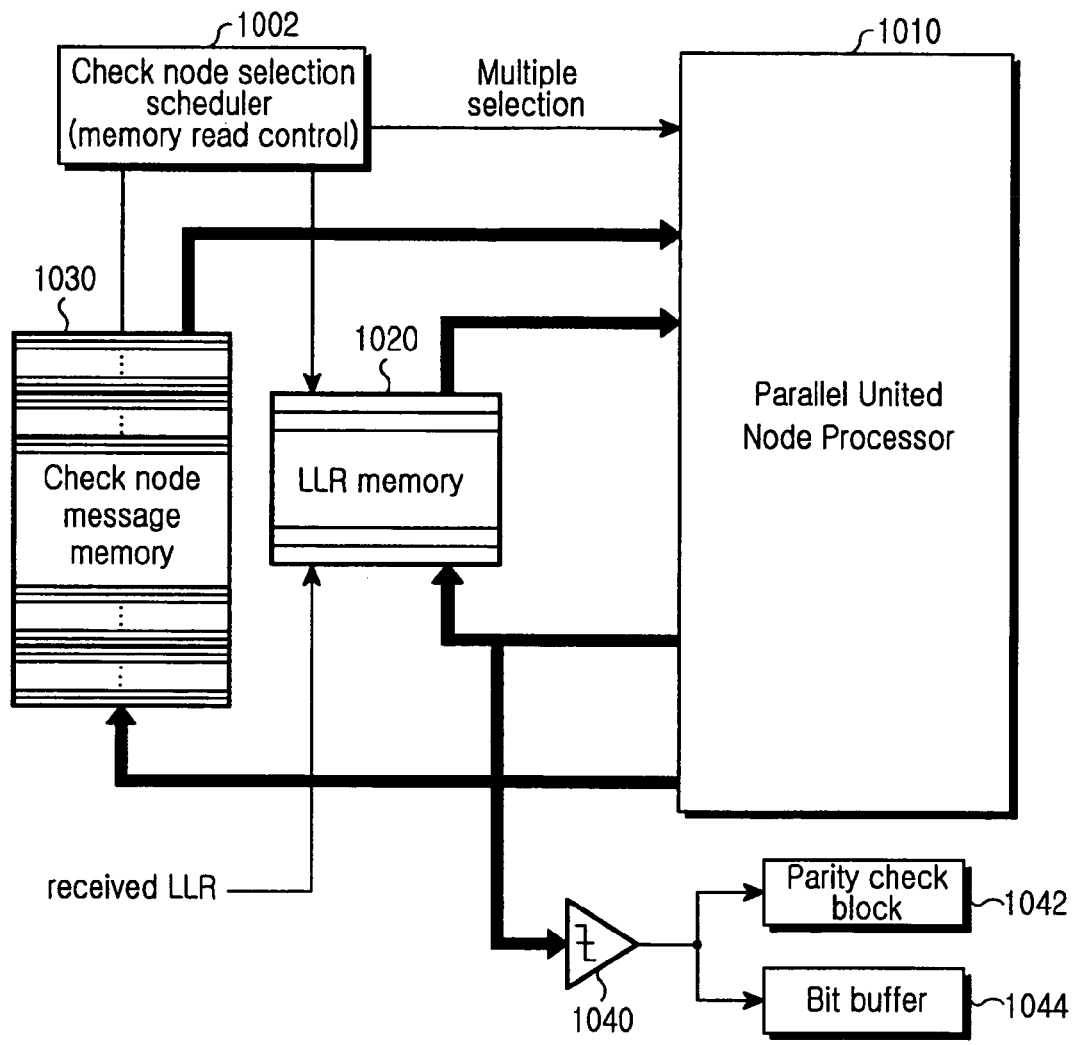
FIG. 10 is a diagram illustrating a structure of a parallel LDPC decoder according to another embodiment of the present invention.

FIG. 10 is a diagram illustrating a structure of a parallel LDPC decoder according to another embodiment of the present invention.

Referring to FIG. 10, the LDPC decoder comprises a check node selection scheduler 1002, a united node processing block 1010 for performing check node processing and LLR updates, an LLR memory 1020 segmented into as many sub-metric blocks as the number of check nodes, a check node message memory 1030 also segmented into as many sub-metric blocks as the number of check nodes, and a hard-decision block 1040.

The check node selection scheduler 1002 can select one or more check nodes for check node processing among the check nodes of a check node processor either sequentially or uniformly according to a predetermined rule. The check node selection scheduler 1002 performs check node scheduling such that when a plurality of check nodes are selected, collision should not occur during simultaneous access of the same LLR values or during memory access. In the case of a block-type systematic LDPC code, such a parallel structure can be implemented simply, and the LDPC decoder can be implemented with the memory configuration of FIG. 6B and the parallel united check node processor.

The united node processing block 1010, the LLR memory 1020 and the check node message memory 1030, both of which are segmented into as many sub-metric blocks as the number of check nodes, and the hard-decision decoding block 1040, are each substantially equal in operation to those in FIG. 7, so a detailed description thereof will be omitted herein for simplicity.

Herein, bold lines between blocks of FIG. 10 represent parallel input/output of a plurality of united node processors that operate in parallel. For example, in a structure wherein a parity check matrix of an LDPC code is segmented into P×P blocks, all of the check node messages belonging to one block can be read as one word. The read check node messages then preferably must undergo permutation according to the parity check matrix.

When the parity check matrix is randomly generated, the parity check matrix should preferably be designed such that no collision occurs during access of the check node message memory 1030 and the LLR memory 1020. In this case, a method of scheduling check node selection can be provided such that united node processors in the united node processing block 1010 do not simultaneously access the same memories, or that provide an appropriate delay between the united node processors.

As can be understood from the foregoing description, embodiments of the present invention improve the inefficient memory segmentation and decoding algorithm for an LDPC code, and simultaneously perform check node processing and variable node processing, thereby improving throughput. In addition, embodiments of the present invention contribute to a reduction in hardware complexity through simple memory segmentation and simplification of node processors.

While the invention has been shown and described with reference to certain exemplary embodiments thereof, it will be understood by those skilled in the art that various changes in form and detail may be made therein without departing from the scope of the invention as defined by the appended claims.

What is claimed is:

1. An apparatus for decoding a low density parity check (LDPC) code that includes a plurality of check nodes and a plurality of variable nodes according to a parity check matrix, the apparatus comprising:
a check node selection scheduler for selecting at least one check node for check node processing among the check nodes;
a log likelihood ratio (LLR) memory for storing an input LLR value for the variable nodes as an initial LLR value, and storing updated LLR values for variable nodes connected to the selected check node;
a check node message memory for storing a check node message indicative of a result value of check node processing on the selected check node; and
at least one united node processor for generating a variable node message by subtracting the check node message of the selected check node stored in the check node message memory from corresponding LLR values read from the LLR memory, performing check node processing on the variable node message, calculating an LLR value updated by adding the variable node message to the check node processing result value, and delivering the calculated LLR value to the LLR memory.

2. The apparatus of claim 1, wherein the check node selection scheduler is configured to index the plurality of check nodes, and either sequentially select the check nodes in the indexed order one by one, or select at least one of the plurality of check nodes according to a predetermined rule.

3. The apparatus of claim 2, wherein the check node selection scheduler is configured to select at least one of the check nodes such that the same LLR values are not simultaneously read from the LLR memory.

4. The apparatus of claim 1, further comprising:
a variable node message associated with the selected check node, wherein the variable node message is calculated by subtracting the check node message of the selected check node from instantaneous LLR values of the connected variable nodes in accordance with the following equation, $$q_{nm}^{(j+1)} = L_n^i - r_{mn}^{(j)}$$

wherein m denotes an index of the selected check node, n denotes an index of each of the variable nodes connected to the selected check node, $q_{nm}^{(j+1)}$ denotes a variable node message during $(j+1)^{th}$ iterative decoding, and $L_n^i$ denotes an instantaneous LLR value of an $n^{th}$ variable node in a step before node processing on the selected check node is performed.

5. The apparatus of claim 4, wherein the check node message is calculated in accordance with the following equation, $$r_{mn}^{(j+1)} = F(q_{n_1m}^{(j+1)}, \ldots, q_{n_{d_c-1}m}^{(j+1)}), \text{ when } n_0 = n$$

wherein $r_{mn}^{(j+1)}$ denotes a check node message during $(j+1)^{th}$ iterative decoding, F denotes a check node processing function of the check node message, $d_c$ denotes the number of variable node messages connected to an $m^{th}$ check node message, and n denotes an index of the variable node message and has a range of $n_0$ through $n_{d_c-1}$.

6. The apparatus of claim 5, wherein the updated LLR value is calculated in accordance with the following equation, $$L_n^0 = q_{nm}^{(j+1)} + r_{mn}^{(j+1)} = L_n^I - r_{mn}^{(j)} + r_{mn}^{(j+1)}$$

wherein $L_n^0$ denotes the updated LLR value, and $L_n^I$ denotes the initial LLR value.

7. The apparatus of claim 1, further comprising:
a hard-decision decoding block for performing hard-decision decoding on the updated LLR value;
a bit buffer for storing the hard-decision decoding result; and
a parity check block for performing parity check on the hard-decision decoding result, stopping an operation of the united node processor if the parity check result is good, and iterating the operation of the united node processor if the parity check result is bad.

8. The apparatus of claim 1, wherein the parity check block is configured to perform the parity check when all of the check nodes have been selected one by one.

9. The apparatus of claim 1, wherein the LLR memory and the check node message memory are each segmented into sub-metric blocks corresponding to the plurality of check nodes.

10. The apparatus of claim 9, wherein each of the sub-metric blocks is configured to store a check node message value corresponding to its associated check node or an LLR value of a variable node connected to its associated check node.

11. The apparatus of claim 1, wherein the at least one united node processor corresponds to the at least one selected check node.

12. A method for decoding a low density parity check (LDPC) code that includes a plurality of check nodes and a plurality of variable nodes according to a parity check matrix, the method comprising the steps of:
selecting at least one check node for check node processing among the check nodes;
reading a check node message corresponding to the selected check node and calculating a variable node message by subtracting the check node message value from a log likelihood ratio (LLR) value of variable nodes connected to the check node;
generating a check node message by performing check node processing on the calculated variable node message and storing the generated check node message;
calculating an updated LLR value by adding the generated check node message to the LLR value and storing the updated LLR value; and
performing hard-decision and parity check on the updated LLR value.

13. The method of claim 12, wherein the selection step comprises the steps of:
indexing the plurality of check nodes; and
either sequentially selecting the check nodes in the indexed order one by one, or selecting at least one of the plurality of check nodes according to a predetermined rule.

14. The method of claim 13, wherein the selection step comprises the step of:
selecting at least one of the check nodes such that the same LLR values are not simultaneously read.

15. The method of claim 13, wherein the step of performing hard-decision and parity check comprises the steps of:
performing hard-decision on the updated LLR value; and
performing parity check on the hard-decision result, stopping iterative decoding if the parity check result is good, and performing iterative decoding if the parity check result is bad.

16. The method of claim 12, further comprising the step of:
calculating a variable node message associated with the selected check node by subtracting the check node message of the selected check node from instantaneous LLR values of the connected variable nodes in accordance with the following equation, $$q_{nm}^{(j+1)} = L_n^i - r_{mn}^{(j)}$$

wherein m denotes an index of the selected check node, n denotes an index of each of the variable nodes connected to the selected check node, $q_{nm}^{(j+1)}$ denotes a variable node message during $(j+1)^{th}$ iterative decoding, and $L_n^i$ denotes an instantaneous LLR value of an $n^{th}$ variable node in a step before node processing on the selected check node is performed.

17. The method of claim 16, further comprising the step of:
calculating the check node message in accordance with the following equation, $$r_{mn}^{(j+1)} = F(q_{n_1 m}^{(j+1)}, \ldots, q_{n_{d_c-1} m}^{(j+1)}), \text{ when } n_0 = n$$

wherein $r_{mn}^{(j+1)}$ denotes a check node message during $(j+1)^{th}$ iterative decoding, F denotes a check node processing function of the check node message, $d_c$ denotes the number of variable node messages connected to an $m^{th}$ check node message, and n denotes an index of the variable node message and has a range of $n_0$ through $n_{d_c-1}$.

18. The method of claim 17, further comprising the step of:
calculating the updated LLR value in accordance with the following equation, $$L_n^0 = q_{nm}^{(j+1)} + r_{mn}^{(j+1)} = L_n^I - r_{mn}^{(j)} + r_{mn}^{(j+1)}$$

wherein $L_n^0$ denotes the updated LLR value, and $L_n^I$ denotes the initial LLR value.

19. The method of claim 12, wherein the parity check is performed when all of the check nodes have been selected one by one.

20. The method of claim 12, wherein the LLR value and the check node message are stored a memory that is segmented into sub-metric blocks being independently mapped to the plurality of check nodes.

* * * * *